(12) United States Patent
Boone et al.

(10) Patent No.: US 7,403,385 B2
(45) Date of Patent: Jul. 22, 2008

(54) EFFICIENT AIRFLOW MANAGEMENT

(75) Inventors: Earl Wayne Boone, Round Rock, TX (US); William C. Johnson, Austin, TX (US); Earl J. Devenport, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/368,900

(22) Filed: Mar. 6, 2006

(65) Prior Publication Data

US 2007/0206353 A1 Sep. 6, 2007

(51) Int. Cl.
*H05K 7/20* (2006.01)
*H05K 5/00* (2006.01)

(52) U.S. Cl. .................. 361/692; 361/695; 361/694; 454/184

(58) Field of Classification Search ......... 361/688–695, 361/714, 752, 724, 720, 722, 748, 749; 62/259.2; 174/50; 312/223.2; 454/184–185; 211/41.17
See application file for complete search history.

(56) References Cited

U.S. PATENT DOCUMENTS

| | | | |
|---|---|---|---|
| 3,147,403 A | | 9/1964 | Cressman et al. |
| 5,375,038 A | | 12/1994 | Hardt |
| 5,473,507 A | * | 12/1995 | Schwegler et al. .......... 361/690 |
| 5,644,472 A | * | 7/1997 | Klein .......................... 361/695 |
| 5,751,550 A | | 5/1998 | Korinsky |
| 5,914,858 A | | 6/1999 | McKeen et al. |
| 5,995,368 A | | 11/1999 | Lee et al. |
| 6,011,701 A | * | 1/2000 | Kopp et al. ................. 361/818 |
| 6,059,385 A | | 5/2000 | Guhl |
| 6,061,236 A | * | 5/2000 | Klein .......................... 361/695 |
| 6,180,045 B1 | * | 1/2001 | Brandenburg et al. ....... 264/263 |
| 6,219,236 B1 | * | 4/2001 | Hirano et al. ............... 361/695 |
| 6,226,182 B1 | * | 5/2001 | Maehara ..................... 361/695 |
| 6,307,749 B1 | * | 10/2001 | Daanen et al. ............... 361/704 |
| 6,359,779 B1 | | 3/2002 | Frank, Jr. et al. |
| 6,466,448 B1 | * | 10/2002 | Baik .......................... 361/752 |
| 6,556,438 B1 | | 4/2003 | Bolognia et al. |
| 6,567,271 B2 | * | 5/2003 | Stone et al. ................. 361/724 |
| 6,593,673 B1 | * | 7/2003 | Sugai et al. ................. 307/116 |
| 6,604,799 B2 | | 8/2003 | Searby et al. |
| 6,618,248 B1 | * | 9/2003 | Dalheimer .................. 361/687 |
| 6,678,157 B1 | * | 1/2004 | Bestwick .................... 361/695 |

(Continued)

OTHER PUBLICATIONS

Christopher W. Argento, et al., "Forced Convection Air-Cooling of a Commercial Electronic Chassis: An Experimental and Computational Case Study," IEEE Transaction on Components, Packaging, and Manufacturing Technology, Part A., vol. 19, No. 2, Jun. 1996, pp. 248-257.

*Primary Examiner*—Anatoly Vortman
*Assistant Examiner*—Bradley H Thomas
(74) *Attorney, Agent, or Firm*—BainwoodHuang

(57) ABSTRACT

An improved air flow management has an air control device for blocking air from low impedance airflow pathways without high thermal components and directing the air flow initially at specific components with high thermal loading. Other components are cooled by the air as it passes from the high thermal loading component to exit from the unit. The air control device directs the air flow by locating and sizing apertures in the air control device based on the location and thermal load of the components on the printed circuit board. Accordingly, the unit can require less air flow through the unit and smaller or no heat sinks than conventional methods.

22 Claims, 6 Drawing Sheets

U.S. PATENT DOCUMENTS

| | | | |
|---|---|---|---|
| 6,704,199 B2 * | 3/2004 | Wiley | 361/695 |
| 6,724,624 B1 * | 4/2004 | Dodson | 361/695 |
| 6,801,430 B1 * | 10/2004 | Pokharna | 361/695 |
| 6,813,149 B2 | 11/2004 | Faneuf et al. | |
| 6,862,181 B1 * | 3/2005 | Smith et al. | 361/690 |
| 6,912,131 B2 * | 6/2005 | Kabat | 361/720 |
| 6,927,976 B1 | 8/2005 | Malone et al. | |
| 6,980,435 B2 * | 12/2005 | Shum et al. | 361/695 |
| 7,061,761 B2 * | 6/2006 | Tucker et al. | 361/695 |
| 7,068,505 B2 * | 6/2006 | Kosugi | 361/690 |
| 7,167,363 B1 | 1/2007 | Cushman et al. | |
| 2002/0122296 A1 * | 9/2002 | Stone et al. | 361/687 |
| 2002/0154481 A1 * | 10/2002 | Wagner | 361/694 |
| 2006/0120039 A1 * | 6/2006 | Yuval | 361/694 |
| 2006/0120043 A1 * | 6/2006 | Wolford et al. | 361/695 |
| 2006/0133036 A1 * | 6/2006 | Durney | 361/695 |

* cited by examiner

EFFICIENT AIRFLOW MANAGEMENT

BACKGROUND

One of the byproducts of electrical device operation is heat. Heat can be a concern in an electrical device because electrical devices and their circuitry generally work better at lower or ambient temperatures. Higher operating temperatures can have many negative effects including decreasing the life of the electrical device. In addition, the higher temperatures can also reduce the performance of the device for various reasons including electrical resistance can increase resulting in slowing of signal speed.

There are many methods for removing heat from electrical devices including heat sinks and fans/blowers. Heat sinks are generally a metal structure with a surface to contact the electronic device and an array of fins or protrusions to create a large surface area to dissipate heat through conduction and convection. In addition, the heat sink increases the thermal mass of the electronic device to stabilize the increase of the temperature when the system is in use.

The heat sink can be used in conjunction with a fan or blower. The fan or blower is designed to push or pull air across the electronic device. The air absorbs heat through convection and removes it from the electronic device. The fan or blower takes the heat area away from the area near the electronic device and replaces it with cooler air allowing for a larger temperature gradient.

SUMMARY

While heat sinks and fans/blowers work to remove heat, unfortunately neither device, separately nor in combination, works optimally. Heat sinks take up space on the printed circuit board and create design concerns as the designer attempts to minimize the size of the printed circuit board assembly or increase the components on the board. In addition, heat sinks are an added cost to the printed circuit board assembly both in the component cost and assembly cost.

The use of fans and/or blowers alone in general has difficulties. Airflow tends to take the path of lowest impedance. Components and other items in the device cause boundary layers that cause drag and turbulence. Therefore the majority of the air flows through the device without interacting with the components. In conventional designs, because of poor air flow, heat sinks and larger components that can tolerate more heat are used. In addition, larger fans/blowers are used to pass more air mass through the device.

In contrast to the above system and components to remove heat, the improved air flow management system has an air control device for blocking airflow to non-critical locations (e.g., circuit board devices which are not high heat concerns) and allowing airflow to critical locations (e.g., high power circuit board components). Within minimal leakage of the airflow to the non-critical location, the full cooling potential of the airflow can be harnessed for removing heat from the critical locations. As a result, air cooling efficiency is maximized without the need for excessive or over provisioned fan assemblies. Rather, modest fan assemblies can be employed thus reducing power supplies, consumed space, costs, etc.

In some arrangements, the system is configured to block air from low impedance airflow pathways without high thermal components and direct the air flow initially at specific components with high thermal loading. Other components are cooled by the air as it passes from the high thermal loading component to the intake of the blower and on to exit from the unit. The air control device directs the air flow by locating and sizing apertures in the air control device based on the location and thermal load of the components on the printed circuit board. Accordingly, the unit can require less air flow through the unit and smaller or no heat sinks than conventional methods.

One arrangement is a unit having a printed circuit board with at least one device having a thermal load and an air control device that is generally parallel to the printed circuit board. The air control device blocks air from low impedance airflow pathways without high thermal components and has at least one air passage aperture positioned relative to the device having the thermal load for directing a flow of air from one side of the air control device to the other side of the air control device in proximity to the device having the thermal load therein cooling the device with the thermal load.

In an arrangement, a blower is associated with the air control device for pulling air through the air passage aperture in the air control device to provide air flow over at least one device having a thermal load.

In an arrangement, the air passage's aperture is at least three air passage apertures. Each of the air passage apertures are spaced and based on the location of the devices having a thermal load located on the printed circuit board. The air control device is appropriately spaced above the printed circuit board. In an arrangement, the air control device has at least one air passage aperture in proximity to the edge of the air control device for passing air across portions of the printed circuit board spaced from the thermal device load and the air passage aperture.

In an arrangement, the air control device is generally planar and has at least one depression in the device such that at least one air passage aperture in the air control device is spaced from the planar surface and closer in proximity to the printed circuit board and the device with the thermal load than the remainder of the air control device.

In some arrangements, an electronic unit or device has a chassis, a blower, a printed circuit board assembly, and an air control device. The chassis has at least one intake opening for allowing air into the chassis and at least one exhaust opening for allowing air out of the chassis. The blower is associated with the exhaust opening for pulling air out of the chassis. The printed circuit board assembly has a printed circuit board and a plurality of devices mounted on the printed circuit board, at least one of the devices having a high thermal load. The printed circuit board assembly is mounted in the chassis; the printed circuit board defines a board plane.

The air control device is mounted in the chassis and is generally parallel to and spaced from the printed circuit board assembly. The air control device is positioned such that at least one intake opening is located on one side of the air control device and at least one exhaust opening is located on the other side of the air control device. The air control device blocks air from low impedance airflow pathways without high thermal load components. The air control device has at least one air passage aperture for passage of air from one side of the air control device to the other side of the air control device. At least one air passage aperture is positioned to direct the flow of air across or on to the high thermal load.

In one arrangement, the electronic unit has in addition an electromagnetic interference (EMI) cage for limiting unwanted radiation into and out of the electronic unit. The air control device is located within the EMI cage for directing air to the components with high thermal load without EMI consideration.

The air control device is spaced sufficiently close to the printed circuit board to effectively eliminate low impedance airflow pathways and sufficiently spaced from the printed circuit board to allow sufficient air flow to cool the components. In one arrangement, the air control device is spaced above the printed circuit board less than 3 times the height of the average components on the printed circuit board. The area within the chassis is less than 450 cubic inches.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved air flow management system has an air control device for blocking airflow to non-critical locations (e.g., circuit board devices which have no high heat concerns) and allowing airflow to critical locations (e.g., high power circuit board components). With minimal leakage of the airflow to the non-critical location, the full cooling potential of the airflow can be harnessed for removing heat from the critical locations. As a result, air cooling efficiency is maximized without the need for excessive or over-provisioned fan assemblies. Rather, modest fan assemblies can be employed thus reducing power supplies, consumed space, costs, etc.

Figure 1:
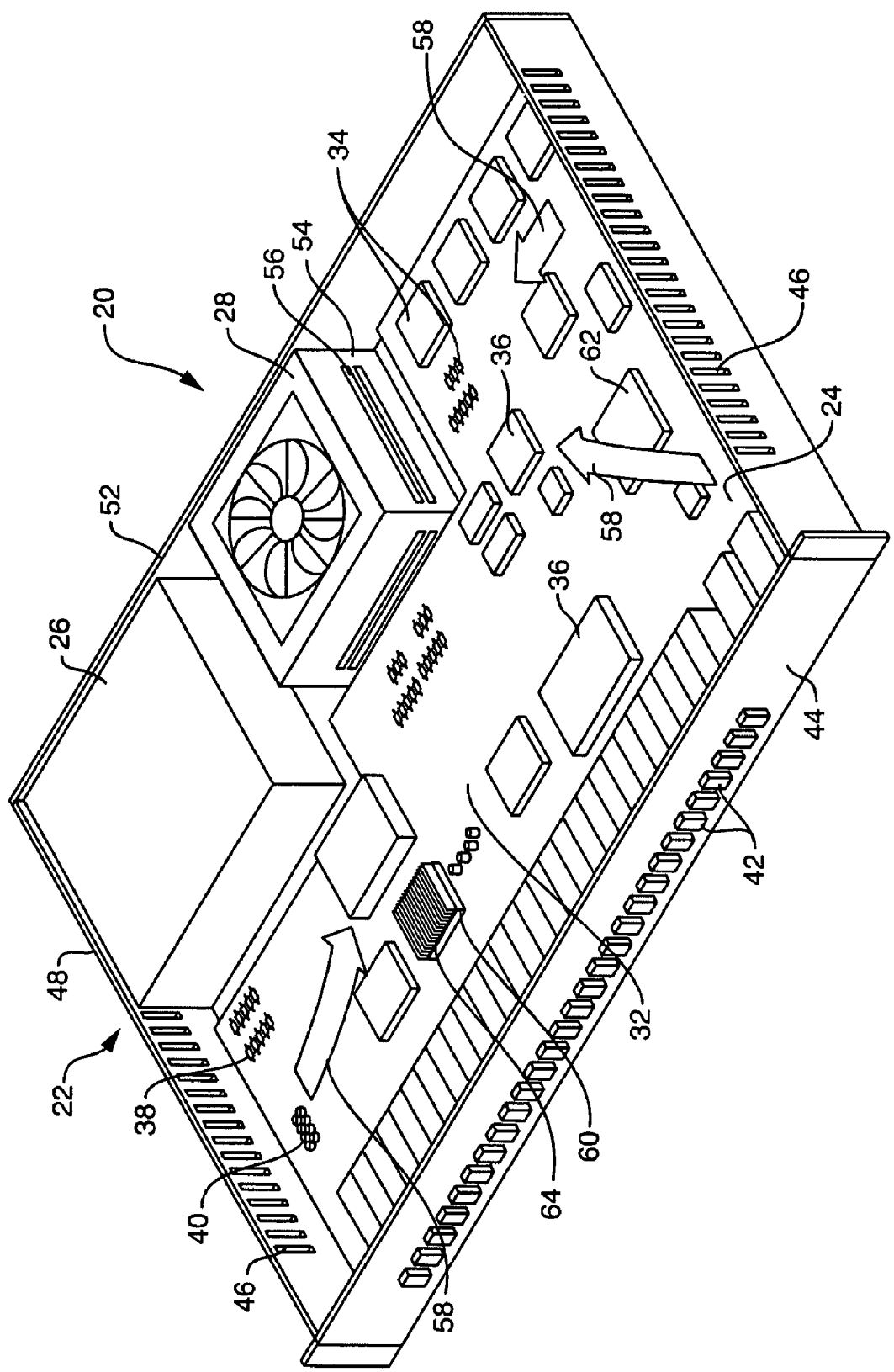
FIG. 1 is a perspective view of a rack unit electronic device according to the prior art with the top removed.
Figure 3:
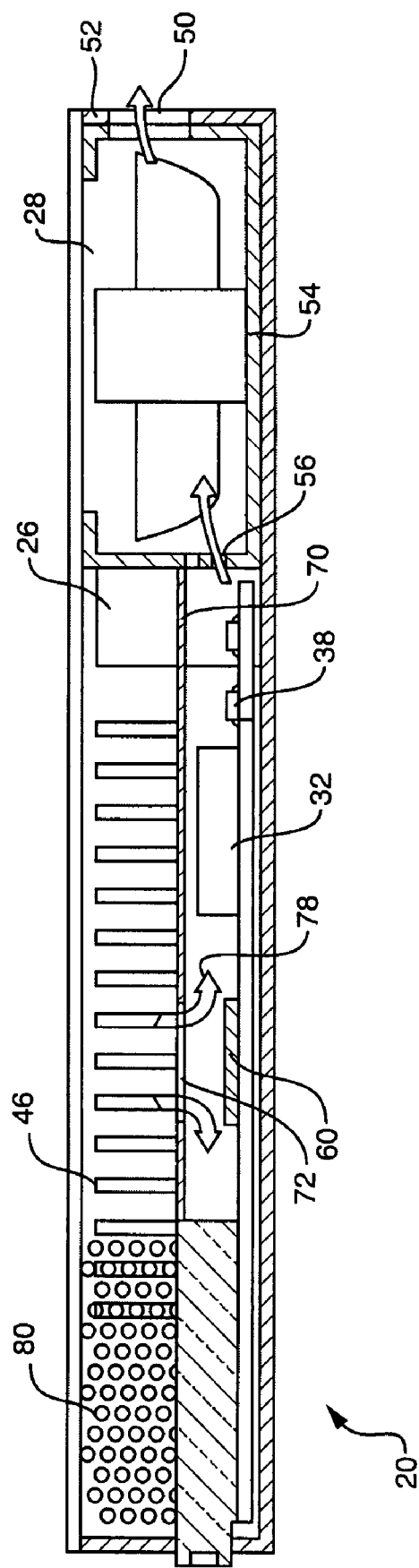
FIG. 3 is a side sectional view of a rack unit electronic device with the air control device.
Figure 5:
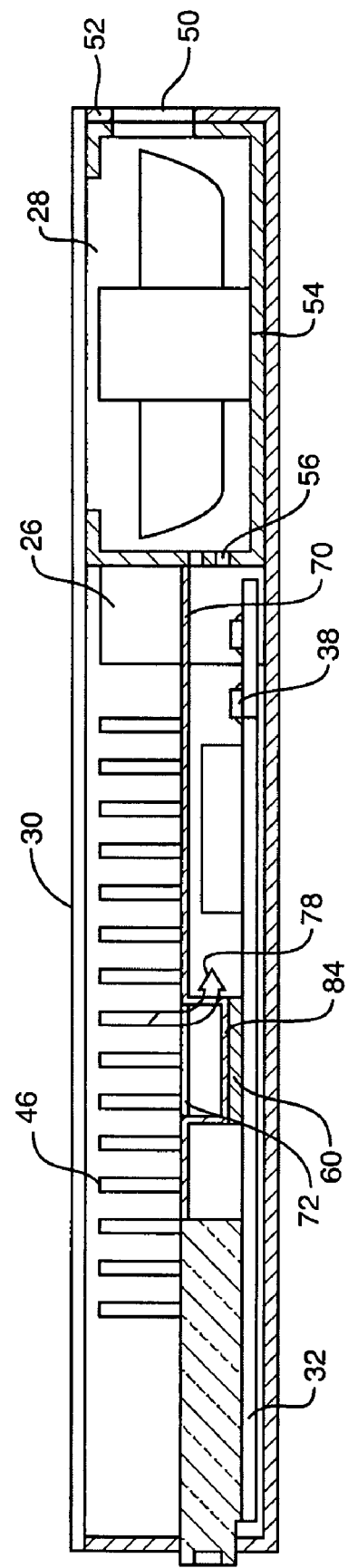
FIG. 5 is a side sectional view of a rack unit electronic device with an alternative air control device.

When referring to the drawing in the description which follows, like numerals indicate like elements. FIG. 1 shows an electronic device 20, such as a router, having a chassis 22 enclosing a printed circuit board assembly (PCBA) 24, a power supply 26, and a fan or blower 28. The cover 30, as seen in FIG. 5, of the chassis 22 is removed in FIG. 1. The printed circuit board assembly 24 has a printed circuit board (PCB) 32 having a series of components 34. The components 34 include a plurality of integrated circuits 36, a plurality of resistors 38, and a plurality of capacitors 40. The electronic device 20 has a series of ports 42 on the front wall 44 of the chassis 22 for connecting interfaces such as cables. The ports 42 are connected to components 34 on the PCB 32. In the electronic device 20 shown, the blower 28 pulls air through a plurality of intake openings or vents 46 on the side walls 48 and pushes the air out one or more exhaust openings, vents 50, as seen in FIG. 3, on the rear wall 52. The blower 28 has a housing 54 with a plurality of slots 56 where the air is pulled into the blower 28.

In one arrangement, the electronic device 20 is a rack mounted device. In a rack mounted device, one common dimension is the width of 19 inches. A typical height of a unit is one and three quarters inches (1¾"). With a depth of 13 inches, the total area of the electronic device is less than 450 cubic inches.

When the unit or device 20 is running, not all the components 34 generate the same amount of heat or thermal loading. The flow of the air is represented by a plurality of large arrows 58. In addition, the majority of the airflow is across the top of the chassis 22 in that there is little or no impedance above the components 34 in contrast to lower and in contact with the components 34. Therefore a minimum of air mass makes contact with the components 34 to cool the components 34 in the conventional method.

In the embodiment shown, it has been determined through analysis that there is a pair of high thermal load components 60 and 62. The analysis could be done several ways including using commercial software such as FLOTHERM or ICEPAK to determine cooling requirements. In the conventional method, heat sinks and/or larger blowers would be used to extract heat from the high thermal load components 60 and 62. A heat sink 64 is shown in phantom secured to component 60.

Figure 2:
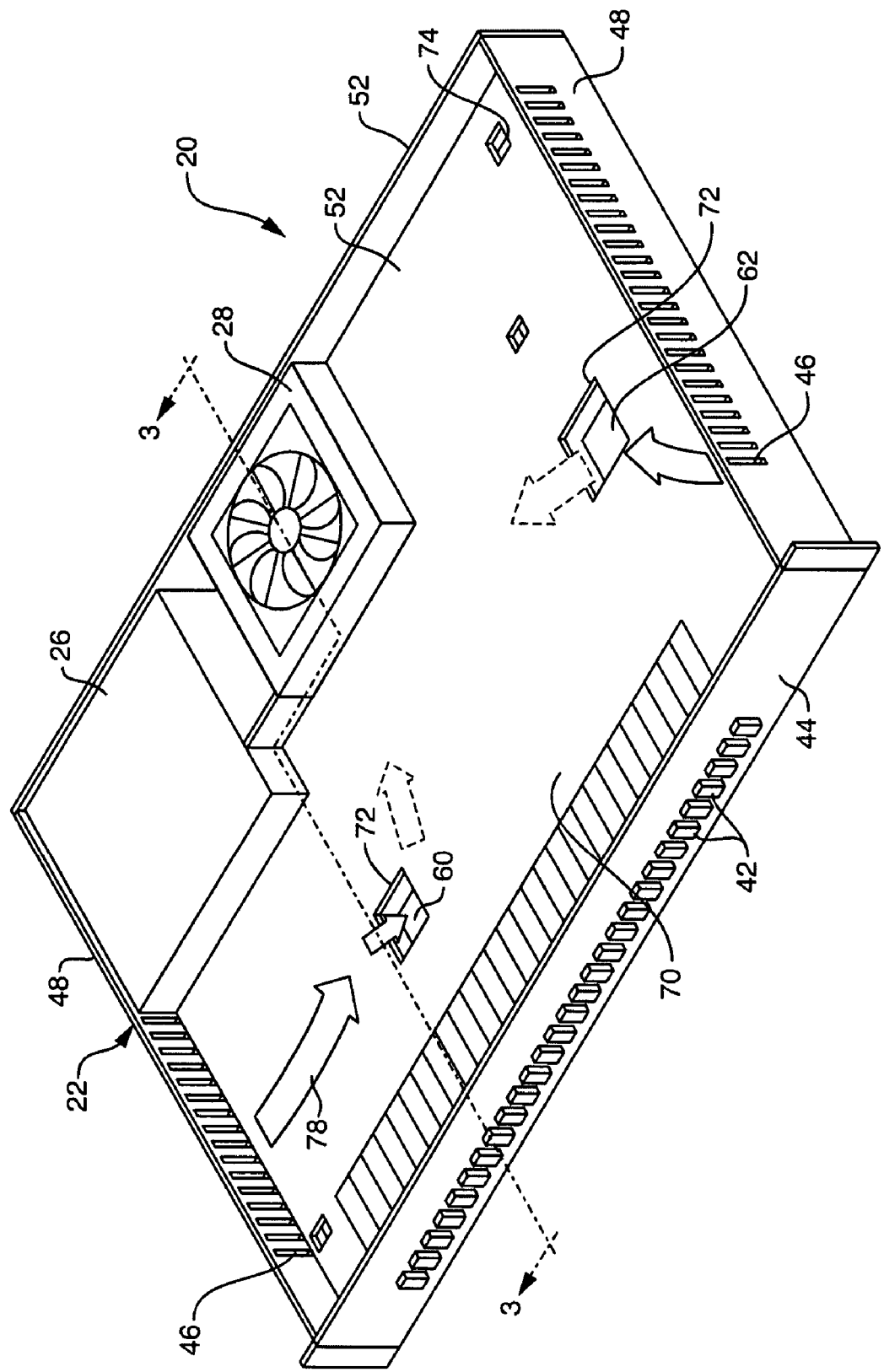
FIG. 2 is a perspective view of a rack unit electronic device with the top removed and an air control device.

FIG. 2 is a perspective view of the electronic device 20 with the cover 30 removed and an air control device 70 mounted in the chassis 22. The air control device 70 blocks the flow of the air from the input openings or vents 46 on the side walls 48 to go directly to the slots 56 of the housing 54 of the blower 28, as seen in FIG. 1, and outputted through the vents 50 on the rear wall 52. By blocking the air flow from going directly from the input openings 46 to the exhaust openings 50, the air flow device 70 eliminates low impedance airflow pathways in the chassis 22. The air control device 70 has a pair of large air passage apertures 72 that directly overlie the high thermal load components 60 and 62 for redirecting the air that was blocked from low impedance airflow pathways to the thermal loads of the high thermal load components 60 and 62. In addition the air control device 70 has a series of smaller air passage apertures 74 for providing air flow to other locations on the PCBA 24, as seen in FIGS. 1 and 2. The apertures 72 and 74 are sized based on the amount of air flow in linear feet per minute required to adequately cool the component.

The heat sink 64, which is shown in FIG. 1, is not required with the air control device 70. The flow of the air is represented by a plurality of large arrows 78 in FIG. 2. The arrows in hidden line represent the air flow under the air control device 70.

FIG. 3 is a side sectional view taken along the line 3-3 of FIG. 2 of the electronic device 20 with the air control device 70. The air control device 70 is parallel to and overlying the PCB 32 and spaced in close proximity to the components 34. The air flow enters through the intake openings or vents 46 located above the air control device 70. The air is drawn through the apertures 72 and 74 in the air control device 70. In that the large air passage apertures 72 are positioned over the high thermal load components 60 and 62, only component 60 shown in FIG. 3; these components 60 and 62 receive maximum air flow. In addition, in that the air has not been heated by flowing past other components prior to coming in contact with the high thermal load components 60, there is the largest possible temperature gradient to allow for pulling heat from the components. The air is pulled from between the printed circuit board 32 and the air control device 70 in to the slots 56 in the housing 54 of the blower 28 and vented out of the rear wall 52 of the chassis 22 through the exhaust opening 50.

In the arrangement described above of a rack mounted electronic device, the air control device 70 is in the lower half of the chassis 22 and in close proximity to the printed circuit board 32. In one arrangement, the air control device 70 is spaced above the printed circuit board less than 3 times the height of the average components on the printed circuit board. The air control device 70 directs ambient air 78 directly on the thermal loads of the high thermal load components 60 with the chassis 22 with maximum efficiency by eliminating the low impedance airflow pathways in the chassis.

Certain electronic units require an EMI (electromagnetic interference) cage 80 to limit unwanted radiation or signals from leaving the unit 20 and interfering with other devices and likewise limit unwanted radiation or signals from entering the unit 20 and causing interference. In some situations, the chassis 22 can act as the EMI cage depending on several factors including the size of the openings in the chassis including the intake openings and the exhaust openings 46 and 50. FIG. 3 shows a portion of an EMI cage 80 that is separate from and distinct to that of the chassis 22 and the air control device 70.

While not designed as an EMI cage in that the air control device 70 has large apertures, the air control device 70 in conjunction with the chassis 22 may form an EMI cage in that the serpentine route the air flows through in the metal passages ways minimizes the likelihood that an unwanted signal can follow the path and cause interference.

Figure 4:
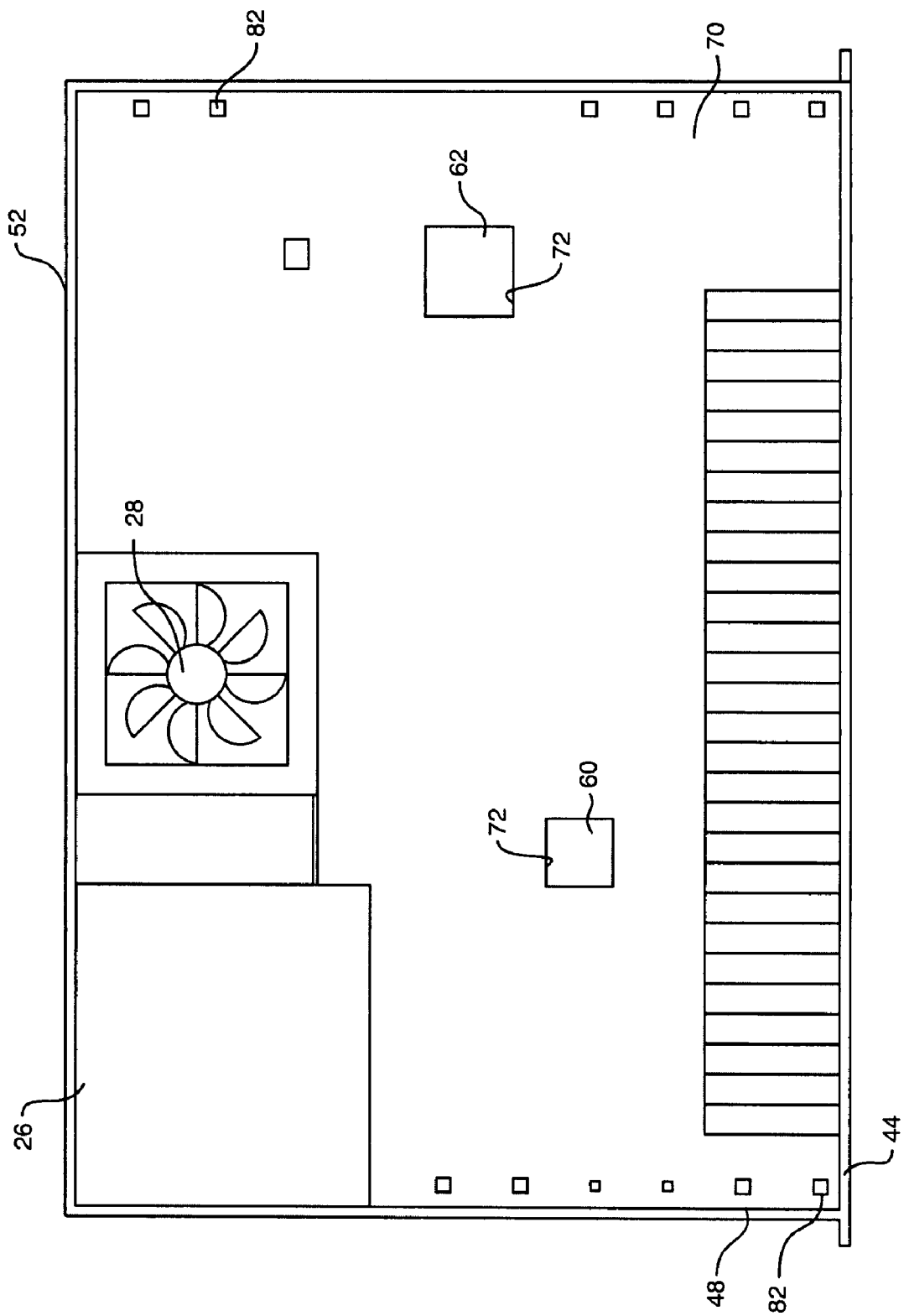
FIG. 4 is a top view of the air control device in the rack unit electronic device.

FIG. 4 is a top view of the electronic device 20 with the air control device 70. The air control device 70 is shown in addition to the two large apertures 72 overlying the high thermal load components 60 and 62, a plurality of smaller apertures 82 located in proximity to the walls 44 and 48 to reduce dead spots where there is not air flow between the air control device 70 and the printed circuit board 32. In the embodiment shown, it has been determined that no apertures 82 are needed near the rear wall 52. The apertures 82 are sized such that sufficient air flows through to maintain air flow in proximity to the corner and edges of the printed circuit board 32 while at the same time ensuring that the majority of the air flow initially passes in proximity to the high thermal load components 62.

FIG. 5 is a side view of an alternative air control device 70 in a rack unit electronic device 20. Similar to the view shown in FIG. 3, the air control device 70 is parallel and overlies the printed circuit board 32 and is spaced in close proximity to the components 34. In addition, the air flow enters through the intake openings or vents 46 located above the air control device 70. The air is drawn through the apertures in the air control device 70 and there is a large air passage aperture 72 overlying the high thermal load component 60 to ensure the component receives maximum air flow. However, in addition, the air control device 70 is made of a material that has a high thermal conductivity to dissipate heat, such as copper or aluminum. In addition, the air control device 70 may have a component engaging portion 84 that projects downward from the plane of the rest of the air control device 70 and engages the high thermal load component 60 to draw heat away from the component by conduction in addition to convection through the air. A thermal transfer material may be interposed between the component engaging portion 84 and the high thermal load component 60.

Figure 6:
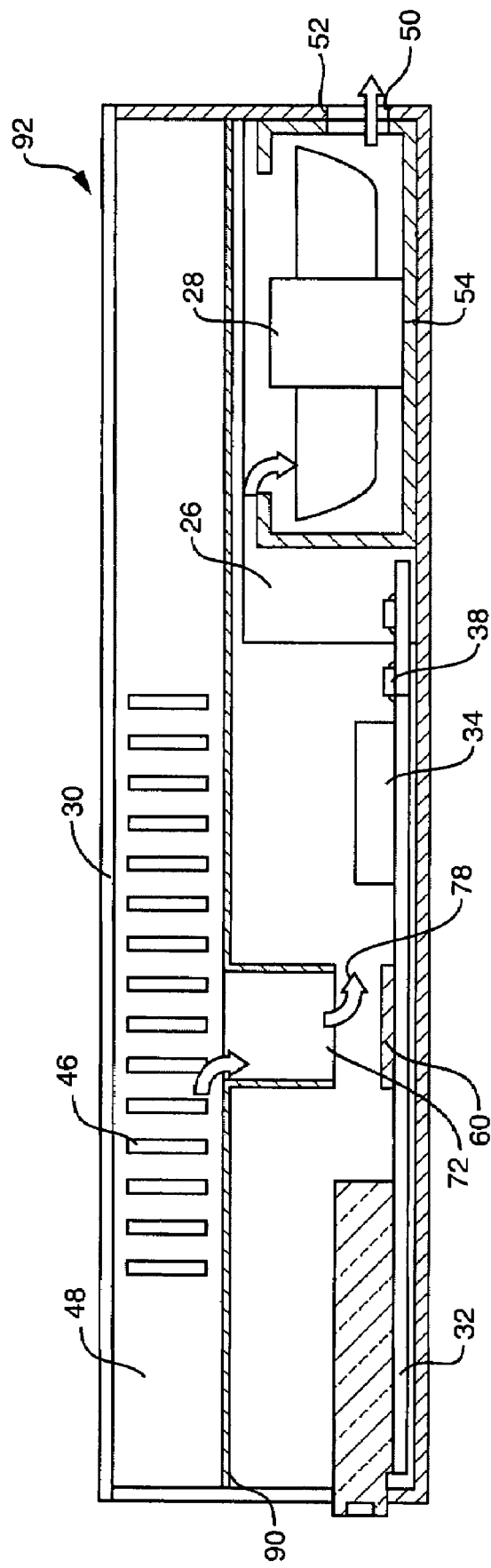
FIG. 6 is a side sectional view of an alternative electronic device with an alternative air control device.

FIG. 6 is a side view of another alternative embodiment of the air control device 90. In contrast to the other embodiments shown, the air control device 90 is not in a device 20 that has a very short height such as a 1¾ inch box. Rather the height of the electronic unit or device 92 is such that there is a large area for air to flow through. As in the previous embodiment, in the conventional devices, the air has a tendency to flow above the components 34 on the printed circuit board 32 and not cool the components. The air control device 90 is placed generally parallel with the printed circuit board. The air control device 90 blocks the flow of the air from the input openings or vents 46 on the side walls 48 to go directly to the blower 28, as seen in FIG. 1, and outputted through the vents 50 on the rear wall 52. The air control device 90 has a large air passage aperture 72 that directly overlies the high thermal load component 60. The air control device 90 can have additional large air passage apertures or smaller air passage apertures as discussed above. While the blower 28 can have the slots 56 in the housing 54 as shown in the previous embodiments, the blower 28 shown in FIG. 6 draws air out of the chassis 22 from above and vents it out the rear wall through vents 50.

In one arrangement, the air control device 90 is formed of a molded plastic. In another arrangement, the air control device 90 is formed from a stamped sheet of metal. In one arrangement, the air control device 90 works in conjunction with the component and housing to create the blockage to eliminate the low impedance airflow pathways.

As described above, the air control device 90 is configured to substantially block airflow to non-targeted areas (e.g., non-critical locations) and to allow airflow to targeted areas (e.g., critical locations). In particular the device 90 intelligently separates a housing environment into a source of ambient air (i.e., a space above the device 90) and a local circuit board space (i.e., a space between the device and the PCB surface.) Air the passed from the ambient air source into the local circuit board space through designated channels while being substantially blocked from flowing into the local circuit board space through other avenues. Accordingly, air cooling efficiency is optimized without the need for excessive of over provisioned fan assemblies. Rather, modest fan assemblies can be employed thus reducing power supplies, consumed space, cost, etc.

While this invention has been particularly shown and described with references to preferred embodiments thereof, it will be understood by those skilled in the art that various changes in form and details may be made therein without departing from the spirit and scope of the invention as defined by the appended claims.

It is recognized that more than a blower or fan can be used to draw air through the chassis. It is recognized that the air control device can have a scoop or dam in conjunction with the air passage aperture to assist in directing ambient air directly on the thermal load of the high thermal load component 60 within the chassis 22 with maximum efficiency.

It is recognized that the air control device can have portions that extend to engage the printed circuit board to inhibit leakage of air flow over the printed circuit board without components.

What is claimed is:

1. A unit comprising:

a printed circuit board having at least one component having a thermal load; and an air control device generally parallel to the printed circuit board, the air control device disposed between an intake opening and an exhaust opening to direct air from low impedance airflow pathways and having at least one air passage aperture positioned relative to the at least one component having the thermal load for directing a flow of air from the intake opening disposed in proximity to a first side of the air control device to the exhaust opening disposed in proximity to a second side of the air control device, the second side of the air control device opposing the first side of the air control device and the air flowing in proximity to the at least one component having the thermal load thus cooling the at least one component with the thermal load, the at least one air passage aperture spaced and sized based on the location of the at least one component having a thermal load located on the printed circuit board;

wherein:
the air control device comprises a component engaging portion extending from the air control device and into a local circuit board space defined by the air control device and the printed circuit board, the component engaging portion disposed in proximity to the at least one air passage aperture and in thermal communication with the at least one component having the thermal load; and
the air control device is formed of high thermal conductivity material configured to (i) receive heat from the at least one component having the thermal load, via the component engaging portion and (ii) dissipate the received heat.

2. A unit of claim 1 further comprising:
a blower associated with the air control device for pulling air through the at least one air passage aperture in the air control device to provide air flow by the at least one component having a thermal load.

3. A unit of claim 2 wherein the at least one air passage aperture in the air control device is at least three air passage apertures overlying the printed circuit board, each of the at least three air passage apertures spaced and sized based on the location of the at least one component having the thermal load located on the printed circuit board.

4. A unit of claim 2 wherein the air control device is spaced above the printed circuit board less than 3 times the average height of the at least one component on the printed circuit board.

5. A unit of claim 2 wherein the air control device is generally planar and has at least one depression in the device such that the at least one air passage aperture in the air control device is spaced from a planar surface of the air control device and closer in proximity to the printed circuit board and the at least one component with the thermal load than the remainder of the air control device.

6. A unit of claim 2 wherein the air control device has a second air passage aperture in proximity to the edge of the air control device for passing air across portions of the printed circuit board spaced from the at least one component with the thermal load and the at least one air passage aperture.

7. A unit comprising:
a printed circuit board having at least one component having a thermal load;
an air control device generally parallel to the printed circuit board, the air control device disposed between an intake opening and an exhaust opening to direct air from low impedance airflow pathways and having at least three air passage apertures overlying the printed circuit board and positioned relative to the at least one component having the thermal load for directing a flow of air from the intake opening disposed in proximity to a first side of the air control device to the exhaust opening disposed in proximity to second side of the air control device, the second side of the air control device opposing the first side of the air control device and the air flowing in proximity to the at least one component having the thermal load thus cooling the at least one component with the thermal load, wherein the air control device is formed of high thermal conductivity material to dissipate heat, each of the at least three air passage apertures spaced and sized based on the location of the at least one component having the thermal load located on the printed circuit board; and
a blower associated with the air control device for pulling air through the at least three air passage apertures in the air control device to provide air flow by the at least one component having a thermal load;

wherein:
the air control device comprises a component engaging portion extending from the air control device and into a local circuit board space defined by the air control device and the printed circuit board, the component engaging portion disposed in proximity to the at least one air passage aperture and in thermal communication with the at least one component having the thermal load; and
the air control device is formed of having thermal conductivity material configured to (i) receive heat from the at least one component having the thermal load, via the component engaging portion and (ii) dissipate the received heat.

8. A unit of claim 7 wherein the air control device contacts the at least one component with the thermal load to draw heat from the at least one component.

9. An electronic unit comprising:
a chassis, the chassis having at least one intake opening for allowing air into the chassis and at least one exhaust opening for allowing air out of the chassis;
a blower associated with the exhaust opening for pulling air out of the chassis;
a printed circuit board assembly having a printed circuit board and a plurality of components mounted on the printed circuit board, at least one of the components having a high thermal load, the printed circuit board assembly mounted in the chassis, the printed circuit board defining a board plane; and
an air control device mounted in the chassis disposed between the intake opening and the exhaust opening and generally parallel to and spaced from the printed circuit board assembly, the air control device positioned such that the at least one intake opening is disposed in proximity to a first side of the air control device and the at least one exhaust opening disposed in proximity to a second side of the air control device the second side of the air control device opposing the first side of the air control device and, the air control device directing air from low impedance airflow pathways, the air control device having at least one air passage aperture for passage of air from the first side of the air control device to the second side of the air control device, the at least one air passage aperture positioned to direct the flow of air on the at least one of the components with the high thermal load, the at least one air passage aperture spaced and sized based on the location of the at least one of the components having the high thermal load located on the printed circuit board;

wherein:
the air control device comprises a component engaging portion extending from the air control device and into a local circuit board space defined by the air control device and the printed circuit board, the component engaging portion disposed in proximity to the at least one air passage aperture and in thermal communication with the at least one component having the thermal load; and
the air control device is formed of high thermal conductivity material configured to (i) receive heat from the at least one component having the thermal load, via the component engaging portion and (ii) dissipate the received heat.

10. An electronic unit of claim 9 further comprising:
an electromagnetic interference (EMI) cage for limiting unwanted radiation into and out of the electronic unit.

11. An electronic unit of claim 10 wherein the air control device is located within the EMI cage for directing air to the at least one of the components with the high thermal load without EMI consideration.

12. An electronic unit of claim 9 wherein the at least one air passage aperture in the air control device is at least three air passage apertures, each of the at least three air passage apertures spaced and sized based on the location of the at least one of the components having the high thermal load located on the printed circuit board.

13. An electronic unit of claim 9 wherein the air control device is spaced sufficiently close to the printed circuit board to effectively eliminate low impedance airflow pathways and sufficiently spaced from the printed circuit board to allow sufficient air flow to cool the plurality of components.

14. An electronic unit of claim 13 wherein the area within the chassis is less than 450 cubic inches.

15. An electronic unit of claim 9 wherein the air control device is generally planar and has at least one depression in the device such that the opening in the air control device is spaced from a planar surface of the air control device and closer in proximity to the printed circuit board and the at least one of the components with the thermal load than the remainder of the air control device.

16. An electronic unit of claim 9 wherein the air control device is formed of high thermal conductivity material to dissipate heat.

17. An electronic unit of claim 16 wherein the air control device contacts the at least one of the components having the high thermal load to draw heat from the at least one of the components.

18. An electronic unit of claim 9 wherein the air control device has a second air passage aperture in proximity to the edge of the air control device for passing air across portions of the printed circuit board spaced from the at least one of the components having the high thermal load and the at least one air passage aperture.

19. An electronic unit of claim 9 wherein the at least one air passage aperture is centered over the at least one of the components with the high thermal load.

20. An electronic unit of claim 9 wherein the air control device is configured to inhibit leakage of air over the printed circuit board without the plurality of components.

21. An electronic unit of claim 9 further comprising:
an electromagnetic interference (EMI) cage for limiting unwanted radiation into and out of the electronic unit, wherein the air control device is located within the EMI cage for directing air to the at least one of the components with the high thermal load without EMI consideration;
wherein the air control device is formed of high thermal conductivity material to dissipate heat;
the at least one air passage aperture in the air control device is at least three air passage apertures overlying the printed circuit board, each of the at least three air passage apertures spaced and sized based on the location of the at least one of the components having the thermal load located on the printed circuit board; and
the air control device is generally planar and has at least one depression in the air control device such that at least one of the air passage aperture in the air control device is spaced from a planar surface of the air control device and is closer in proximity to the printed circuit board and the at least one of the components with the thermal load than the remainder of the air control device.

22. An electronic unit of claim 21 wherein the air control device is spaced sufficiently close to the printed circuit board to effectively eliminate low impedance airflow pathways and sufficiently spaced from the printed circuit board to allow sufficient air flow to cool the at least one of the components with the high thermal load and the air control device contacts the at least one of the components with the high thermal load to draw heat from the at least one of the components with the high thermal load.

* * * * *